(12) United States Patent
Nakayama et al.

(10) Patent No.: US 9,768,316 B2
(45) Date of Patent: Sep. 19, 2017

(54) OXIDE SEMICONDUCTOR THIN FILM AND THIN FILM TRANSISTOR

(71) Applicant: SUMITOMO METAL MINING CO., LTD., Tokyo (JP)

(72) Inventors: Tokuyuki Nakayama, Tokyo (JP); Eiichiro Nishimura, Tokyo (JP); Masashi Iwara, Tokyo (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

(21) Appl. No.: 14/905,008

(22) PCT Filed: Jul. 16, 2014

(86) PCT No.: PCT/JP2014/068961
§ 371 (c)(1),
(2) Date: Jan. 14, 2016

(87) PCT Pub. No.: WO2015/008805
PCT Pub. Date: Jan. 22, 2015

(65) Prior Publication Data
US 2016/0163865 A1    Jun. 9, 2016

(30) Foreign Application Priority Data

Jul. 16, 2013    (JP) .................................. 2013-147193

(51) Int. Cl.
*H01L 27/12* (2006.01)
*H01L 29/786* (2006.01)
(Continued)

(52) U.S. Cl.
CPC .......... *H01L 29/7869* (2013.01); *C23C 14/08* (2013.01); *C23C 14/3414* (2013.01);
(Continued)

(58) Field of Classification Search
CPC ........... H01L 29/7869; H01L 29/78696; H01L 27/1225; H01L 27/1285
See application file for complete search history.

(56) References Cited

U.S. PATENT DOCUMENTS

| 9,269,826 B2 | 2/2016 | Hosono et al. |
| 2010/0129660 A1 | 5/2010 | Nakayama et al. |
| (Continued) | | |

FOREIGN PATENT DOCUMENTS

| JP | H07182924 A | 7/1995 |
| JP | 2007277039 A | 10/2007 |
| (Continued) | | |

OTHER PUBLICATIONS

International Search Report and Written Opinion dated Oct. 21, 2014, from the corresponding PCT/JP2014/068961.
(Continued)

*Primary Examiner* — Cuong Q Nguyen
(74) *Attorney, Agent, or Firm* — Katten Muchin Rosenman LLP

(57) ABSTRACT

Provided is a crystalline oxide semiconductor thin film comprising only bixbyite-structured $In_2O_3$ phase, suitable as a channel layer material for a thin film transistor, and having excellent etching properties in an amorphous state and a low carrier density and high carrier mobility in a crystalline state. An amorphous oxide thin film is formed using, as a target, an oxide sintered body which comprises indium, gallium, oxygen, and unavoidable impurities, the gallium content being in a range of 0.09 to 0.45 in terms of a Ga/(In+Ga) atomic ratio, has a $In_2O_3$ phase having a bixbyite structure as the main crystal phase, and has a $GaInO_3$ phase having a $\beta$-$Ga_2O_3$-type structure, or a $GaInO_3$ phase having a $\beta$-$Ga_2O_3$-type structure and a $(Ga, In)_2O_3$ phase finely dispersed therein. The amorphous oxide thin film is finely (Continued)

processed by performing etching using photolithography, and is annealed.

7 Claims, 1 Drawing Sheet

(51) Int. Cl.
    *C23C 14/08*     (2006.01)
    *H01L 21/02*     (2006.01)
    *C23C 14/34*     (2006.01)

(52) U.S. Cl.
    CPC .. *H01L 21/02565* (2013.01); *H01L 21/02631* (2013.01); *H01L 27/1225* (2013.01); *H01L 27/1285* (2013.01); *H01L 29/78696* (2013.01)

(56) References Cited

U.S. PATENT DOCUMENTS

| | | |
|---|---|---|
| 2011/0163277 A1 | 7/2011 | Ikisawa et al. |
| 2011/0180763 A1 | 7/2011 | Utsuno et al. |
| 2012/0292617 A1* | 11/2012 | Ebata .............. H01L 21/02565 257/43 |
| 2013/0221351 A1 | 8/2013 | Ebata et al. |

FOREIGN PATENT DOCUMENTS

| | | |
|---|---|---|
| JP | 2010219538 A | 9/2010 |
| JP | 2011146571 A | 7/2011 |
| JP | 2012253315 A | 12/2012 |
| JP | 2012253372 A | 12/2012 |
| JP | 2013067855 A | 4/2013 |
| JP | 2013128128 A | 6/2013 |
| WO | 2009/008297 A1 | 1/2009 |
| WO | 2009128424 | 10/2009 |
| WO | 2010/032422 A1 | 3/2010 |
| WO | 2010/035716 A1 | 4/2010 |

OTHER PUBLICATIONS

Notification of Reasons for Rejection dated Jul. 21, 2015, from the corresponding JP 2015-512959A.

"In2O3 High Mobility Transparent Conductive Film", T. Koita et al., Journal of the Surface Science Society of Japan, vol. 29, No. 1, 2008; p. 18 to 24.

"Effect of hydrogen incorporation on the negative bias illumination stress instability in amorphous In—Ga—Zn—O thin-film transistors", K. Noh et al., J. Appl. Physics 113 (2013) 063712.

"Hydrogen passivation of electron trap in amorphous In—Ga—Zn—O thin-film transistors", Y. Hanyu et al., Appl. Physics Letter 103 (2013) 202114.

* cited by examiner

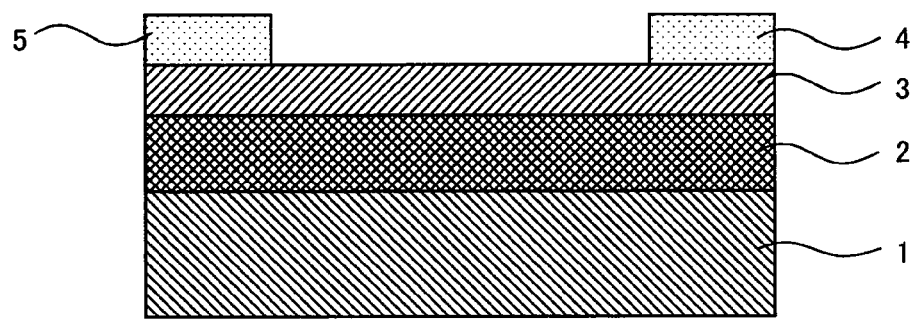

OXIDE SEMICONDUCTOR THIN FILM AND THIN FILM TRANSISTOR

TECHNICAL FIELD

The present invention relates to an oxide semiconductor thin film and a thin film transistor using this oxide semiconductor thin film.

BACKGROUND ART

A thin-film transistor (TFT) is one kind of a field effect transistor (FET). A TFT is a three-terminal element that has as the basic structure a gate terminal, a source terminal, and a drain terminal, in which a semiconductor thin film that is formed on a substrate is used as a channel layer where electrons or holes move, and is an active element having a function of applying voltage to the gate terminal, controlling the current that flows in the channel layer, and switching the current between the source terminal and drain terminal. Currently, polycrystalline silicon thin film or amorphous silicon thin film is widely used as the channel layer of a TFT.

Of these, amorphous silicon thin film can be formed as a uniform film on a large-area 10th generation glass substrate, so is widely used as a channel layer of a TFT for a liquid-crystal panel. However, the mobility of carrier electrons (carrier mobility) is a low 1 $cm^2V^{-1}sec^{-1}$ or less, so application in a high-definition panel TFT is difficult. In other words, as the definition of liquid crystals becomes higher, there is a need for high-speed driving of thin-film transistors, and in order to achieve this kind of high-speed driving of thin-film transistors, it is necessary to use semiconductor thin film that displays a carrier mobility that is higher than the 1 $cm^2V^{-1}sec^{-1}$ carrier mobility of amorphous silicon thin film.

On the other hand, polycrystalline silicon thin film displays a high carrier mobility of about 100 $cm^2V^{-1}sec^{-1}$, so can be said to have adequate characteristics as a channel layer material for a thin-film transistor for a high-definition panel. However, in a polycrystalline silicon thin film, the carrier mobility decreases at the crystal grain boundaries, so there is a problem in that there is a lack of uniformity in the substrate surface, and variations in the thin-film transistor characteristics occur. Moreover, polycrystalline silicon thin film is obtain by forming an amorphous silicon film with a substrate temperature of 300° C. or less, and then crystallizing that film by an annealing process, however, when doing this, the annealing process must be performed using a special method such as excimer laser annealing, so there is a problem in that the cost becomes high. In addition, the size of the glass substrate that can be used is limited to about a 5th generation glass substrate, so there is a limit to cost reduction, and product development is also limited. Therefore, currently there is a need for a material that can be used as the material for a channel layer of a thin-film transistor that has the excellent characteristics of both an amorphous silicon thin film and a polycrystalline silicon thin film, and that can be obtained at low cost.

For example, JP 2010219538 (A) discloses a transparent amorphous oxide semiconductor thin film that is formed using a vapor phase film deposition method and includes the elements of In, Ga, Zn and O. This transparent amorphous oxide thin film has a composition of $InGaO_3(ZnO)_m$ when crystallized (where m is a natural number less than 6), and without adding impurity ions, it is possible to achieve a carrier mobility that is greater than 1 $cm^2V^{-1}sec^{-1}$, and a carrier density that is $1\times10^{16}$ $cm^{-3}$ or less.

However, the amorphous oxide semiconductor thin film has problems in that it is inherently easy for oxygen deficiencies to be generated, and due to external factors such as heat, the behavior of the electrons is not always stable, which causes the operation of the thin-film transistor to become unstable. Moreover, when a negative bias is continuously applied to a thin-film transistor under visible-light irradiation, there is also a problem in that the threshold voltage will shift to the negative side, and a light negative bias deterioration phenomenon will occur.

Therefore, in recent years, instead of amorphous oxide semiconductor thin film, research for using a crystalline oxide semiconductor thin film as the channel layer of a thin-film transistor is advancing.

For example, WO 2010032422 (A1) discloses an oxide semiconductor thin film having bixbyite-structured $In_2O_3$ phase in which gallium is solid-solved in indium oxide, with the Ga/(In+Ga) atomic ratio being 0.001 to 0.12, and the content of indium and gallium with respect to all of the metal atoms being 80 atomic % or greater. Moreover, JP 2011146571 (A) discloses an oxide semiconductor thin film that includes bixbyite-structured indium oxide phase as the crystal structure, and that has a Ga/(In+Ga) atomic ratio of 0.10 to 0.15.

In the technology disclosed in these documents, after an amorphous oxide thin film has been formed using a sputtering method with an oxide sintered body that includes bixbyite-structured $In_2O_3$ single phase as the target, a crystalline oxide semiconductor thin film is obtained by performing an annealing process on the amorphous oxide thin film. Therefore, in the case of the oxide semiconductor thin film disclosed in these documents, the problem described above that is caused by an amorphous oxide semiconductor thin film does not occur. Moreover, the crystalline oxide semiconductor thin film disclosed in these documents achieves a high carrier mobility of 40 $cm^2V^{-1}sec^{-1}$ or greater.

In WO 2010032422 (A1) and JP 2011146571 (A), first an amorphous film is formed, and after that a crystalline oxide semiconductor thin film is obtained by performing an annealing process on the amorphous oxide thin film. Typically, in the manufacturing process of a thin-film transistor, after forming an amorphous film, a patterning process to obtain a desired channel layer shape is performed, so wet etching using a weak acid such as an aqueous solution that includes oxalic acid or hydrochloric acid is performed. However, in WO 2010032422 (A1) and JP 2011146572 (A), an oxide sintered body that essentially has only bixbyite structure is used as a sputtering target that will be used in sputtering film formation, so problems occur in that the crystallization temperature of the amorphous film that is formed becomes low, minute crystals are already generated in the stage after film formation, and in the etching process residue occurs, or crystallization partially occurs and etching is not possible. In other words, when applying the oxide semiconductor thin film of WO 2010032422 (A1) and JP 2011146571 (A) to the channel layer of a thin-film transistor, it is difficult to form a desired pattern by using a wet etching method that uses photolithography technology or the like. Therefore, for example, in the examples in WO 2010032422 (A1) and JP 2011146571 (A), a channel layer is formed by using a simple method that uses a metal mask.

In regard to this, JP 2012253315 (A) discloses a thin-film transistor that uses an oxide semiconductor thin film that has a Ga/(In+Ga) atomic ratio of 0.01 to 0.09 as the channel layer. In the case of the technology disclosed in this document, this oxide semiconductor thin film is formed by sputtering film formation in a gaseous mixture (sputtering gas) atmosphere that includes water molecules. In this kind of method, a highly amorphous oxide semiconductor thin film in which oxide crystals are scattered is obtained due to the existence of $H^+$ or $OH^-$ that separates from the water molecules.

However, according to WO 2010035716 (A1), when film is formed by using a sputtering method in an atmosphere in which water molecules exist, there is a possibility that particles will be included in the oxide semiconductor thin film that is obtained.

Moreover, "$In_2O_3$ High Mobility Transparent Conductive Film", T. Koita et al., Journal of the Surface Science Society of Japan, Volume 29, No. 1, 2008; pg. 18 to 24, reports that in oxide semiconductor thin film that is obtained by the method described above, $H^+$ remains in the crystals after the annealing process. It has been pointed out from both theoretical calculation ("Effect of hydrogen incorporation on the negative bias illumination stress instability in amorphous In—Ga—Zn—O thin-film-transistors", K. Noh et al., J. Appl. Physics 113 (2013) 063712) and testing ("Hydrogen passivation of electron trap in amorphous In—Ga—Zn—O thin-film transistors", T. Hanyu et at, Appl. Physics Letter 103 (2013) 202114) that the $H^+$ that remains in the this kind of thin film causes a decrease in the film quality of the oxide semiconductor thin film, or becomes an unnecessary carrier source and may bring about an increase in the carrier density.

On the other hand, the inventors of the present invention proposed in WO 2009008297 (A1) using an oxide sintered body as a target in which indium and gallium are included as oxides, bixbyite-structured $In_2O_3$ phase is the main crystal phase, and in that, $\beta$-$Ga_2O_3$-structured $GaInO_3$ phase, or $GaInO_3$ phase and $(Ga, In)_2O_3$ phase is finely dispersed as crystal particles having an average particle size of 5 μm or less, and the gallium content is such that the Ga/(In+Ga) atomic ratio is 10 atomic % or more and 35 atomic % or less. When film is formed by a sputtering method or an ion-plating method using this target, a highly amorphous oxide thin film is obtained without adding water molecules to the atmosphere gas, so good etching characteristics are expected. However, the oxide sintered body disclosed in WO 2009008297 (A1) is not just bixbyite-structured $In_2O_3$ phase, but also includes other composite oxide phases, so it is unlikely but still unclear whether the crystalline oxide thin film that is obtained from this will only be $In_2O_3$ single phase.

In addition, JP H07182924 (A) discloses that when the gallium content is such that the Ga/(In+Ga) atomic ratio is near 50 atomic %, a $GaInO_3$ transparent conductive thin film will be obtained from a sintered body having β gallium oxide crystal structured $GaInO_3$ single phase that resembles one $Ga_2O_3$ shape.

In other words, JP 2012253372 (A) strongly suggests that from the oxide sintered body disclosed in JP H07182924 (A), a crystalline oxide thin film that includes $\beta$-$Ga_2O_3$-structured $GaInO_3$ phase will be obtained instead of a crystalline oxide thin film that includes bixbyite-structured $In_2O_3$ single phase that is expected to have a high carrier mobility.

RELATED LITERATURE

Patent Literature

[Patent Literature 1] JP 2010219538 (A)
[Patent Literature 2] WO 2010032422 (A1)
[Patent Literature 4] JP 2012253315 (A)
[Patent Literature 5] WO 2010035716 (A1)
[Patent Literature 6] WO 2009008297 (A1)
[Patent Literature 7] JP H07182924 (A)
[Patent Literature 8] JP 2012253372 (A)

Non-Patent Literature

[Non-patent Literature 1] "$In_2O_3$ High Mobility Transparent Conductive Film", T. Koita et al., Journal of the Surface Science Society of Japan, Volume 29, No. 1, 2008; pg. 18 to 24
[Non-patent Literature 2] "Effect of hydrogen incorporation on the negative bias illumination stress instability in amorphous In—Ga—Zn—O thin-film-transistors", K. Noh et al., J. Appl. Physics 113 (2013) 063712
[Non-patent Literature 3] "Hydrogen passivation of electron trap in amorphous In—Ga—Zn—O thin-film transistors", T. Hanyu et al., Appl. Physics Letter 103 (2013) 202114

SUMMARY OF INVENTION

Problem to be Solved by Invention

An object of the present invention is to provide, without using a special process such as water-added sputtering film formation, a crystalline oxide semiconductor thin film that includes only bixbyite-structured $In_2O_3$ phase that is suitable as a thin-film transistor channel layer material, and that in the amorphous state, has excellent etching characteristics, and in the crystalline state, has low carrier density and high carrier mobility. Moreover, an object of the present invention is to provide a thin-film transistor that uses this kind of oxide semiconductor thin film for the channel layer.

Means for Solving Problems

The inventors repeatedly performed testing to form a crystalline oxide semiconductor thin film by forming an amorphous oxide thin film by a sputtering method using an oxide sintered body that includes indium, gallium and unavoidable impurities, and then performing an annealing process thereon. As a result, it was newly found that when the oxide sintered body had a gallium content within a specific range, and included bixbyite-structured $In_2O_3$ phase and $\beta$-$Ga_2O_3$-structured $GaInO_3$ phase, or bixbyite-structured $In_2O_3$, $\beta$-$Ga_2O_3$-structured $GaInO_3$ phase and $(Ga, In)_2O_3$ phase, the oxide thin film that is formed by a sputtering method under normal conditions and using this oxide sintered body as a target becomes an amorphous film that includes no minute crystals or partial crystallization; and by annealing this oxide thin film, a crystallized oxide thin film that includes only bixbyite-structured $In_2O_3$ phase is formed. In other words, it was newly found that the amorphous oxide thin film that is obtained from an oxide sintered body that includes at least $In_2O_3$ phase and $GaInO_3$ phase shows good etching characteristics, and the crystalline oxide semiconductor thin film after the annealing process includes bixbyite-structured $In_2O_3$ single phase for which high carrier mobility is expected.

The oxide semiconductor thin film of the present invention is obtained from an oxide sintered body that includes indium, gallium and unavoidable impurities, the oxide semiconductor thin film being crystalline; wherein the oxide sintered body includes bixbyite-structured $In_2O_3$ phase and $\beta$-$Ga_2O_3$-structured $GaInO_3$ phase, or bixbyite-structured $In_2O_3$ phase, $\beta$-$Ga_2O_3$-structured $GaInO_3$ phase and $(Ga,$ In)$_2$O$_3$ phase; and the gallium content expressed using the Ga/(In+Ga) atomic ratio is greater than or equal to 0.09 and less than or equal to 0.45, and the crystal phase is constructed only by bixbyite-structured In$_2$O$_3$ phase.

Preferably, the gallium content of the oxide semiconductor thin film, is such that the Ga/(In+Ga) atomic ratio is greater than or equal to 0.10 and less than or equal to 0.30.

Moreover, preferably, the carrier density of the oxide semiconductor thin film is $5.0 \times 10^{17}$ cm$^{-3}$ or less, and the carrier mobility is 10 cm$^2$V$^{-1}$sec$^{-1}$ or greater.

Preferably, in the case of this oxide semiconductor thin film, the crystallization temperature of amorphous film before crystallizing by an annealing process is 225° C. or greater.

The thin-film transistor of the present invention includes a source electrode, a drain electrode, a gate electrode, a channel layer, and a gate insulation film, wherein the channel layer includes the oxide semiconductor thin film.

This kind of thin-film transistor can be applied to various kinds of displays.

Effect of Invention

With the present invention, it is possible to provide, without using a special process such as water-added sputtering film formation, a crystalline oxide semiconductor thin film that includes only bixbyite-structured In$_2$O$_3$ phase that is suitable as a thin-film transistor channel layer material, and that in the amorphous state, has excellent etching characteristics, and in the crystalline state has low carrier density and high carrier mobility. Moreover, with the present invention, it is possible to provide a thin-film transistor that uses this kind of oxide semiconductor thin film for the channel layer.

BRIEF DESCRIPTION OF DRAWINGS

FIG. 1 is a cross-sectional view of a TFT element of the present invention.

MODES FOR CARRYING OUT INVENTION

The inventors performed much research for a crystalline oxide semiconductor thin film that in the amorphous state has excellent etching characteristics, and in the crystalline state has low carrier density and high carrier mobility, and is suitable as a channel layer material for a thin film transistor.

As a result, the inventors gained knowledge that, by using as a target an oxide sintered body that included indium, gallium and unavoidable impurities, with the gallium content controlled to within a suitable range, and then performing an annealing process under specified conditions on the amorphous oxide thin film that was formed by using that target, it is possible to obtain an oxide semiconductor thin film that includes only bixbyite-structured In$_2$O$_3$ phase that has a low carrier density and high carrier mobility and that is suitable as a channel layer material for a thin-film transistor. Moreover, knowledge was gained that, before the annealing process, this oxide semiconductor thin film was highly amorphous, and had excellent etching characteristics. The present invention was achieved based on this knowledge.

1. Oxide Semiconductor Thin Film

The oxide semiconductor thin film of the present invention is characterized by being a crystalline oxide semiconductor thin film that is obtained using an oxide sintered body that includes indium, gallium and unavoidable impurities, wherein the oxide sintered body includes bixbyite-structured In$_2$O$_3$ phase and β-Ga$_2$O$_3$-structured GaInO$_3$ phase, or bixbyite-structured In$_2$O$_3$ phase, β-Ga$_2$O$_3$-structured GaInO$_3$ phase and (Ga, In)$_2$O$_3$ phase, and the gallium content of the crystalline oxide semiconductor thin film is such that the Ga/(In+Ga) atomic ratio is 0.09 to 0.45, and the crystal phase thereof includes only bixbyite-structured In$_2$O$_3$ phase.

(1) Composition

The oxide semiconductor thin film of the present invention is characterized by the gallium content being such that the Ga/(In+Ga) atomic ratio is within the range 0.09 to 0.45, and preferably 0.10 to 0.30, and more preferably 0.10 to 0.15. In the present invention, as long as the film formation conditions are suitably controlled, the composition of the oxide sintered body that is used as a target will be passed down to the oxide semiconductor thin film.

In the present invention, the oxide sintered body that is used as a target is such that by controlling the gallium content so that the Ga/(In+Ga) atomic ratio is within the range 0.09 to 0.45, the structure of the oxide sintered body has bixbyite-structured In$_2$O$_3$ phase as the main crystal phase, with β-Ga$_2$O$_3$-structured GaInO$_3$ phase, or β-Ga$_2$O$_3$-structured GaInO$_3$ phase and (Ga, In)$_2$O$_3$ phase being finely dispersed as crystal particles having an average particle size of 5 μm or less. By forming a film using this target, it is possible to form a highly amorphous oxide thin film having excellent etching characteristics. Furthermore, by performing an annealing process on this amorphous oxide thin film, it is possible to suitably eliminate oxygen deficiencies in the thin film by the gallium that has a high affinity for oxygen, and it is possible to obtain a crystalline oxide semiconductor thin film that has a low carrier density of $5.0 \times 10^{17}$ cm$^{-3}$, and a high carrier mobility of 10 cm$^2$V$^{-1}$sec$^{-1}$.

In regard to this, when the Ga/(In+Ga) atomic ratio is less than 0.09, the oxide sintered body that is used as the target includes only bixbyite-structured In$_2$O$_3$ phase, so it is not possible to make the oxide semiconductor thin film after sputtering film formation into an amorphous film having good wet etching characteristics that is necessary for patterning the film into a desired shape. Moreover, the gallium content is low, so it is not possible to sufficiently eliminate the oxygen deficiencies, and so in the crystalline oxide semiconductor thin film that is finally obtained, it is difficult to obtain a carrier density of $5.0 \times 10^{17}$ cm$^{-3}$ or less.

On the other hand, when the Ga/(In+Ga) atomic ratio is greater than 0.45, it becomes easy for β-Ga$_2$O$_3$-structured GaInO$_3$ phase to be generated after the annealing process, and thus it is not possible to obtain a crystalline oxide semiconductor thin film that includes only bixbyite-structured In$_2$O$_3$ phase. As a result, it is not possible to achieve a high carrier mobility of 10 cm$^2$V$^{-1}$sec$^{-1}$ or greater.

In the present invention, the unavoidable impurities are a minute amount of impurities that exist in the raw material powder, or that are unavoidably mixed in during the manufacturing process. It is necessary that the content of such unavoidable impurities be controlled to be 100 ppm by mass or less. When the content of an unavoidable impurity that exceeds this range, and particularly when a tetravalent element such as tin is included, it becomes difficult to control the carrier density of the obtained crystalline oxide semiconductor thin film to be $5.0 \times 10^{17}$ cm$^{-3}$ or less.

Moreover, when making the lowering of the carrier density to a value of $2.0 \times 10^{16}$ cm$^{-3}$ or less a priority in order to place importance on the stability of the thin film transistor, preferably the gallium content will be such that the Ga/(In+Ga) atomic ratio is greater than 0.15 and less than or equal to 0.20.

(2) Crystal Structure

[Before the Annealing Process]

The oxide semiconductor thin film of the present invention is formed using an oxide sintered body that has the crystal structure described above as a target and is formed at room temperature to crystallization temperature or lower, so before the annealing process is highly amorphous, and minute crystals that are the cause of residue in wet etching are not generated, and crystallization of part of the thin film does not occur. When this kind of amorphous oxide thin film is measured using X-ray diffraction measurement, diffraction peaks were not detected for any of the crystal phases that included bixbyite-structured $In_2O_3$ phase, $\beta$-$Ga_2O_3$-structured $GaInO_3$ phase and $(Ga, In)_2O_3$ phase.

In regard to this, as in the conventional technology, in an oxide thin film that is obtained by forming film using an oxide sintered body that includes only the $In_2O_3$ phase as a target, minute crystals exist in the thin film, or part of the thin film is crystallized. Therefore, it can be seen that when performing X-ray diffraction measurement, even though there are only a few, diffraction peaks that are due to the $In_2O_3$ phase are detected.

[After the Annealing Process]

The oxide semiconductor thin film of the present invention is characterized by including only bixbyite-structured $In_2O_3$ phase after an annealing process under specified conditions. Here, including only bixbyite-structured $In_2O_3$ phase means that in X-ray diffraction measurement, diffraction peaks due to the $In_2O_3$ phase are detected, but diffraction peaks due to crystal phases other than this are not detected.

Moreover, the oxide semiconductor thin film of the present invention has reduced oxygen deficiencies and is highly crystalline due to the function of the gallium as described above. Therefore, it is possible to achieve at the same time both low carrier density of $5.0 \times 10^{17}$ cm$^{-3}$ or less, and high carrier mobility of 10 cm$^2$V$^{-1}$sec$^{-1}$ or greater.

Furthermore, in the case of the oxide semiconductor thin film of the present invention, there is no need to add water molecules to the sputtering gas during film formation, so there is little particle generation, and the flatness of the film also becomes excellent.

(3) Film Thickness

The film thickness of the oxide semiconductor thin film of the present invention is appropriately selected according to the usage, however, is preferably 10 nm to 500 nm, and more preferably 20 nm to 300 nm, and even more preferably 30 nm to 100 nm. When the film thickness is less than 10 nm, it is not possible to obtain sufficient crystallinity, so it may not be possible to achieve high carrier mobility. On the other hand, when the film thickness is greater than 500 nm, coloring of the oxide semiconductor thin film may become a problem.

(4) Characteristics

[Crystallization Temperature]

For the amorphous oxide thin film before the annealing process, the crystallization temperature is preferably 225° C. or higher, and more preferably 250° C. or higher. When the crystallization temperature is within such a range, it is possible to avoid crystallization of part of the oxide thin film, or minute crystals being generated in the thin film during film formation, and it is possible to achieve good etching characteristics. The upper limit for the crystallization temperature is not particularly limited, however, in referring to the upper limit for the annealing temperature disclosed in JP 2012253372 (A), as long as the crystallization temperature is 700° C. or lower, the temperature is not an obstacle to the manufacturing of a TFT. In consideration of improving throughput and reducing the heat load on a Tyr manufacturing line, a crystallization temperature of 500° C. or lower is preferred. That kind of crystallization temperature can be easily achieved by controlling the Ga/(In+Ga) atomic ratio within the range described above. Moreover, the crystallization temperature can be measured by using high-temperature X-ray diffraction measurement.

[Etching Characteristics]

The channel layer of a thin-film transistor is generally formed by forming an amorphous film at the substrate temperature that is lower than the crystallization temperature, and then after patterning that film into a desired shape by wet etching, performing an annealing process on this amorphous film in an oxidizing atmosphere. Therefore, it is essential that the amorphous oxide thin film after film formation have excellent etching characteristics. When the etching characteristics are poor, problems occur in that it is not possible to form a desired pattern, and etching residue is generated.

The oxide semiconductor thin film of the present invention, as described above, is highly amorphous before the annealing process, so has excellent etching characteristics, and for example, even in the case of a weak acid such as an aqueous solution that includes oxalic acid or hydrochloric acid, etching residue is not generated, and simple and fast etching is possible.

For example, in the case of etching the oxide semiconductor thin film of the present invention, by adjusting the fluid temperature to room temperature to 50° C. before the annealing process, and performing etching using an etchant (etching fluid) having oxalic acid as the main component, for example ITO-06N manufactured by Kanto Chemical Co., Inc., the etching rate can preferably be made to be 15 nm/min or greater, or more preferably 20 nm/min, and even more preferably 25 nm/min or greater. Here, the etching rate can be measured by the variation of film thickness before and after etching within a specified amount of time.

In the case of the conventional amorphous oxide thin film that is obtained by film formation at room temperature with an oxide sintered body that includes only the $In_2O_3$ phase as the target, when etching is performed under the same conditions, the etching rate generally becomes less than 10 nm/min, and etching residue is generated.

[Carrier Density and Carrier Mobility]

The oxide semiconductor thin film of the present invention has low carrier density that is preferably $5.0 \times 10^{17}$ cm$^{-3}$ or less, and more preferably $2.0 \times 10^{17}$ cm$^{-3}$ or less, and even more preferably $2.0 \times 10^{16}$ cm$^{-3}$ or less. In order for the thin-film transistor to operate stably, it is necessary to have a high on/off ratio (ratio of the resistance in the off state with respect to the resistance in the on state) of $1 \times 10^6$ or greater, however, when the carrier density of the oxide semiconductor thin film of the channel layer is within the range described above, it is possible to easily achieve such an on/off ratio.

Moreover, the oxide semiconductor thin film of the present invention has high carrier mobility that is preferably 10 cm$^2$V$^{-1}$sec$^{-1}$ or greater, and more preferably 15 cm$^2$V$^{-1}$sec$^{-1}$ or greater, and even more preferably 20 cm$^2$V$^{-1}$sec$^{-1}$ or greater. Therefore, the oxide semiconductor thin film of the present invention can suitably be used as a channel layer for a high-definition panel thin-film transistor for which high-speed driving is desired.

[Average Transmittance]

The oxide semiconductor thin film of the present invention has an average transmittance in the visible range (wavelength: 400 nm to 800 nm) that is 80% or greater, and preferably 85% or greater, and more preferably 90% or greater. By controlling the average transmittance in the visible range to be within such a range, it is also possible to use the film as a transparent thin-film transistor (TTFT).

2. Manufacturing Method for an Oxide Semiconductor Thin Film

The method of manufacturing the oxide semiconductor thin film of the present invention includes: a film formation process of forming an amorphous oxide thin film using an oxide sintered body that includes indium, gallium and unavoidable impurities, with the gallium content being such that the Ga/(In+Ga) atomic ratio is within the range 0.09 to 0.45, and the crystal phase being mainly bixbyite-structured $In_2O_3$ phase with $\beta$-$Ga_2O_3$-structured $GaInO_3$ phase, or $\beta$-$Ga_2O_3$-structured $GaInO_3$ phase and $(Ga, In)_2O_3$ phase finely dispersed therein as crystal particles having an average particles size of 5 μm or less as a target; and an annealing process for obtaining a crystalline oxide semiconductor thin film by performing an annealing process on the obtained amorphous oxide thin film.

(1) Target

[Composition]

The composition of the oxide sintered body that is used as the target is passed on to the oxide semiconductor thin film that is obtained. In other words, as the target, it is necessary to use an oxide sintered body that includes indium, gallium, oxygen and unavoidable impurities, with the gallium content being such that the Ga/(In+Ga) atomic ratio is within the range 0.09 to 0.45, and preferably 0.10 to 0.30 and more preferably 0.10 to 0.20. The critical significance of the gallium content in the target is as explained in '1. Oxide Semiconductor Thin Film', so an explanation is omitted here.

[Sintered Body Structure]

As described above, when using an oxide sintered body that includes only bixbyite-structured $In_2O_3$ phase as a target to form a film using a sputtering method, even when the substrate temperature is at room temperature, minute particles are generated, or part of the film is crystallized, so it is not possible to obtain a highly amorphous oxide semiconductor thin film.

However, in the present invention, an oxide sintered body that has bixbyite-structured $In_2O_3$ phase as the main crystal phase, with $\beta$-$Ga_2O_3$-structured $GaInO_3$ phase, or $\beta$-$Ga_2O_3$-structured $GaInO_3$ phase and $(Ga, In)_2O_3$ phase, finely dispersed therein as crystal particles having an average particles size of 5 μm or less is used as a target. When film is formed at room temperature with this kind of target, crystallization of the obtained film is hindered by the $GaInO_3$ phase or $(Ga, In)_2O_3$ phase in the oxide sintered body, and thus it is possible to obtain a very highly amorphous oxide thin film.

The $\beta$-$Ga_2O_3$-structured $GaInO_3$ phase and $(Ga, In)_2O_3$ phase in the bixbyite-structured $In_2O_3$ phase can be confirmed using X-ray diffraction. Moreover, the average particle size of these crystal phases can be found by polishing and etching a cross-section of the oxide sintered body, and then performing measurement using scanning electron microscope-electron backscatter diffraction (SEM-EBSD), and calculating the average value thereof.

$\beta$-$Ga_2O_3$-structured $GaInO_3$ phase, or $\beta$-$Ga_2O_3$-structured $GaInO_3$ phase and $(Ga, In)_2O_3$ phase in the oxide sintered body is formed by the sintering temperature being controlled to be greater than or equal to 1200° C. and less than or equal to 1550° C.

[Density]

The oxide sintered body that is used as the target has density that is preferably 6.3 g/cm$^3$ or greater, and more preferably 6.7 g/cm$^3$ or greater, and even more preferably 6.8 g/cm$^3$ or greater. As a result, it is possible to make the resistance of the oxide sintered body sufficiently low, and during film formation, it is possible to suppress the occurrence of nodules or arcing.

(2) Film Formation Process

Other than using the oxide sintered body described above as a target, the oxide semiconductor thin film of the present invention is not particularly limited, and it is possible to form the film using a known film formation method such as a sputtering method or an ion-plating method. However, with the premise that production will be on an industrial scale, using a sputtering method, and particularly, a direct-current (DC) sputtering method that has little heat effect during film formation and that is capable of high-speed film formation is preferred. Therefore, in the following, an example of performing film formation using a DC sputtering method will be used to explain the method for manufacturing the oxide semiconductor thin film of the present invention.

[Substrate]

It is possible to use a substrate for a semiconductor device such as a glass substrate or Si (silicon) substrate as the substrate on which the oxide semiconductor thin film of the present invention is formed. Moreover, in the case of substrates other than these, as long as the substrate is able to withstand the temperatures during film formation or the annealing process, it is also possible to use a resin substrate or resin film and the like.

[Sputtering Target]

As the sputtering target, it is possible to use a target that is formed by joining (bonding) a backing plate or backing tube to the oxide sintered body described above that has been processed to a specified shape.

[Film Formation Conditions]

The film formation conditions are not particularly limited, and can be appropriately selected according to the characteristics of the sputtering apparatus being used, however, generally it is possible to use film formation conditions such as described below.

First, the sputtering target is placed so that the distance from the substrate is 10 mm to 100 mm. Next, the air evacuation is performed so that the pressure inside the sputtering chamber is $2\times10^{-4}$ Pa or less, after which sputtering gas is introduced, and the gas pressure is adjusted to be 0.1 Pa to 1 Pa, and preferably 0.2 Pa to 0.8 Pa. In this state, direct-current plasma is generated by applying direct-current electric power so that the direct-current power with respect to the surface area of the target, or in other words, so that the direct-current power density is within the range of about 1 W/cm$^2$ to 5 W/cm$^2$, then pre-sputtering is performed for 5 to 30 minutes, after which the position of the substrate is corrected as necessary, and sputtering is performed under the same conditions.

When doing this, the substrate temperature must be adjusted according to the composition of the oxide sintered body that is being used as the target so that an amorphous oxide thin film is obtained. In the present invention, an oxide sintered body having the crystal structure described above is used as the target, so it is possible to form an amorphous oxide thin film even when performing film formation at a substrate temperature that exceeds 300° C. However, in order to improve the throughput and reduce the heat load on the TFT manufacturing line, the substrate temperature is preferably 300° C. or less.

Moreover, preferably a gas mixture of a noble gas and oxygen, and particularly a mixture of argon and oxygen is used as the sputtering gas.

In a normal sputtering method, in order to improve the film-formation speed, the direct-current electric power that is applied is increased. Normally, when a target that is an oxide sintered body that includes β-$Ga_2O_3$-structured $GaInO_3$ phase or $(Ga, In)_2O_3$ phase is used, there is a problem in that these phases remain and become the cause of nodule growth. In regard to this, in the present invention, in the oxide sintered body that is used as the target, the average crystal particle size of these crystal phases is controlled to be 5 μm or less, and the phases are uniformly dispersed, so even when the direct-current electric power that is applied is increased, it is possible to effectively suppress the occurrence of nodules and arcing.

(3) Fine Processing

The amorphous oxide thin film that is obtained is finely processed as necessary by wet etching or dry etching that uses photolithography technology, and formed into a specified pattern. Even without performing this kind of fine processing, in the film formation process, it is possible to form a pattern by masking and then forming an oxide semiconductor thin film. However, in order to form a fine pattern with high precision, preferably photolithography technology is used.

Before the annealing process, the oxide semiconductor thin film of the present invention is highly amorphous, so has excellent wet etching characteristics, and it is possible to perform uniform etching over the entire thin film without generating etching residue.

Particularly, the oxide semiconductor thin film of the present invention can be processed easily and with high precision before the annealing process by wet etching using a weak acid. In that case, the etchant is not particularly limited, and it is generally possible to use any etchant as long as the etchant is a weak acid, however, it is possible to suitably use a weak acid having oxalic acid as the main component, or an aqueous solution that includes hydrochloric acid. More specifically, ITO-06N manufactured by Kanto Chemical Co., Inc. can be suitably used.

When performing fine processing using dry etching, the etching gas is not limited, and for example, it is possible to use sulfur hexafluoride, carbon tetrafluoride, trifluoromethane, xenon difluoride and the like.

(4) Annealing Process

The crystalline oxide semiconductor thin film of the present invention is obtained by performing an annealing process on the amorphous oxide thin film described above in an oxidizing atmosphere. Here, the oxidizing atmosphere is an atmosphere that promotes oxidation of the oxide semiconductor thin film during the annealing process, and indicates an atmosphere that includes at least one of oxygen, ozone, water vapor, and nitrogen oxide.

In the present invention, the annealing process is not limited, and as long as the amorphous oxide thin film is sufficiently crystallized, it is possible to apply a known process. For example, when performing an annealing process using a typical annealing furnace, it is possible to perform the annealing process in conditions such as described below.

The temperature of the annealing process is selected according to the composition of the oxide semiconductor thin film, and should at least be equal to or greater than the crystallization temperature. In order to make the crystallinity of the oxide semiconductor thin film after the annealing process sufficiently high, the annealing temperature is higher than the crystallization temperature by 30° C. or more, and preferably 50° C. or more, and even move preferably 60° C. or more. On the other hand, the upper limit of the temperature of the annealing process is not particularly limited, however, when an amorphous oxide thin film that includes gallium such that the Ga/(In+Ga) atomic ratio is 0.09 to 0.45 is taken to be the object such as in the present invention, the temperature is preferably 700° C. or less.

The amount of time of the annealing process is preferably 1 minute to 120 minutes, and more preferably 5 minutes to 60 minutes. When the processing time is less than one minute, it is not possible to cause the amorphous oxide thin film to sufficiently crystallize. On the other hand, when the processing time is greater than 120 minutes, it is not possible to obtain any further effect, and thus productivity worsens.

When rapid thermal annealing (RTA) using infrared rays or a rapid heating process in a short period of time that uses flash-lamp heating is applied as the annealing process, it is necessary to appropriately adjust the conditions according to the characteristics of the apparatus used regardless of the conditions described above.

3. Thin Film Transistor (1) Construction

The thin-film transistor (TFT element) of the present invention is a thin-film transistor that includes three electrodes (source electrode, drain electrode, and gate electrode), a channel layer, and a gate-insulation film, and the oxide semiconductor thin film of the present invention is applied to the channel layer. The construction of this kind of thin-film transistor is not particularly limited, however, for example, a thin-film transistor having construction such as illustrated in FIG. 1 can be given as an example.

The thin-film transistor in FIG. 1 includes the oxides semiconductor thin film of the present invention and an Au/Ti layered electrode on a $SiO_2$/Si substrate on the surface of which a $SiO_2$ film is formed by thermal oxidation. More specifically, the gate electrode 1 is a Si substrate, the gate-insulation film 2 is a $SiO_2$ film, the channel layer 3 is the oxide semiconductor thin film of the present invention, and the source electrode 4 and drain electrode 5 are Au/Ti layered electrodes.

[Substrate]

In the thin-film transistor in FIG. 1, a $SiO_2$/Si substrate is used, however, the substrate is not limited to this, and it is possible to use a conventionally known substrate for electronic devices, including a thin-film transistor. For example, in addition to a $SiO_2$/Si substrate or Si substrate, it is possible to use a glass substrate such as an alkali-free glass substrate or quartz glass substrate. Moreover, it is also possible to use various kinds of metal substrates, plastic substrates, non-transparent heat-resistant polymeric film substrates such as polyimide substrates and the like.

[Gate Electrode]

In the thin-film transistor in FIG. 1, the gate electrode 1 includes a Si substrate, however is not limited to that. For example, it is also possible to use a metal thin film or metal alloy thin film such as Mo, Al, Ta, Ti, Au, Pt and the like, or it is also possible to use an electrically conductive oxide thin film, nitride thin film, or oxynitride thin film of these metals. Moreover, it is also possible to use various kinds of known conductive polymer materials. In the case of a transparent thin film, it is possible to use a transparent conductive film such as ITO. Furthermore, it is also possible to use a transparent conductive film having the same metal composition as the oxide semiconductor thin film of the present invention. No matter what material is used, good electric conductivity is desired for the gate electrode 1. More specifically, the specific resistance of the gate electrode 1 is preferably controlled to be within the range $1\times10^{-6}$ Ω·cm to $1\times10^{-1}$ Ω·cm, and more preferably controlled to be within the range $1\times10^{-6}$ Ω·cm to $1\times10^{-3}$ Ω·cm.

[Gate-Insulation Film]

As the gate-insulation film 2, it is possible to use a known material such as a metal oxide thin film like $SiO_2$, $Y_2O_3$, $Ta_2O_5$ and Hf oxide, or an insulating polymer material such as a polyimide. The specific resistance of the gate-insulation film 2 is preferably within the range $1\times10^6$ Ω·cm to $1\times10^{15}$ Ω·cm, and more preferably within the range $1\times10^{10}$ Ω·cm to $1\times10^{15}$ Ω·cm.

[Channel Layer]

The specific resistance of the channel layer 3 is not particularly limited, however, preferably is controlled to be within the range $1\times10^{-1}$ Ω·cm to $1\times10^6$ Ω·cm, and more preferably is controlled to be within the range 1 Ω·cm to $1\times10^3$ Ω·cm. In the oxide semiconductor thin film of the present invention, by selecting the film formation conditions of the sputtering method or ion-plating method, or annealing conditions when performing crystallization, it is possible to adjust the amount of oxygen deficiencies that are generated. Therefore, the specific resistance of the channel layer 3 can be easily controlled to be within the range described above.

[Source Electrode and Drain Electrode]

As in the case of the gate electrode 1, it is possible to use a metal thin film or metal alloy thin film of Mo, Al, Ta, Ti, Au, Pt or the like, or it is also possible to use an electrically conductive oxide thin film, nitride thin film, or oxynitride thin film of these metals. Moreover, it is also possible to use various kinds of known conductive polymer materials. In the case of a transparent thin film transistor, it is possible to use a transparent conductive film such as ITO. Furthermore, as necessary, it is also possible to use a film that is formed by layering these thin films. No matter what material is used, good electric conductivity is desired for the source electrode 4 and drain electrode 5. More specifically, the specific resistance of the source electrode 4 and gate electrode 5 is preferably controlled to be within the range $1\times10^{-6}$ Ω·cm to $1\times10^{-1}$ Ω·cm, and more preferably controlled to be within the range $1\times10^{-6}$ Ω·cm to $1\times10^{-3}$ Ω·cm.

(2) Application

The application of the thin-film transistor of the present invention is not limited, however, can be suitably used in a display such as a liquid-crystal display, an organic EL display, MEMS display and the like.

(3) Manufacturing Method for a Thin-Film Transistor

Of the elements of the thin-film transistor of the present invention, the channel layer 3 by a manufacturing method that includes: a film-formation process of forming an amorphous oxide thin film using the oxide sintered body of the present invention described above; and an annealing process of crystallizing the amorphous oxide thin film in an oxidizing atmosphere.

The thin-film transistor of the present invention, including this kind of channel layer 3 can be manufactured by combining the film-formation process and annealing process described above with some known methods. In the following, one example will be explained, however the manufacturing method for the thin-film transistor of the present invention is not limited to the explanation below.

First, a $SiO_2$/Si substrate is formed by forming a $SiO_2$ film on the surface of a highly doped n-type Si wafer using thermal oxidation.

Next, an amorphous oxide thin film having a specified film thickness is formed on the $SiO_2$ film of this substrate using a direct-current magnetron sputtering method with the oxide sintered body of the present invention as a target (film-formation process). When doing this, it is necessary to form the film with the substrate temperature maintained at a temperature that is lower than the crystallization temperature of the oxide semiconductor thin film. The conditions for this film-formation process are the same as the conditions explained in '2. Manufacturing Method for an Oxide Semiconductor Thin Film', so an explanation will be omitted here.

After that, patterning is performed on the obtained amorphous oxide thin film by performing etching using photolithography technology. Patterning can also be performed by performing masking, and then forming an amorphous oxide thin film. However, in order to form a detailed pattern, a method that uses photolithography technology is advantageous.

Next, by performing an annealing process on this amorphous oxide thin film at a temperature that is greater than or equal to the crystallization temperature, a channel layer that includes a crystalline oxide semiconductor thin film having a specified channel length and channel width is obtained. The annealing conditions when doing this are also the same as the conditions explained in '2. Manufacturing Method for an Oxide Semiconductor Thin Film', so an explanation will be omitted here.

Finally, a Ti thin film having a film thickness of 5 nm and an Au thin film having a film thickness of 100 nm are layered in that order to form a source electrode and a drain electrode. The patterning when doing this as well can be performed in the same way as in the case of the channel layer by performing masking, or by performing etching using photolithography technology The thin-film transistor of the present invention can be obtained by the processing described above.

The thin-film transistor of the present invention is not limited to a bottom gate top contact type as illustrated in FIG. 1, and it is also possible to select other forms such as a bottom gate bottom contact type, a top gate bottom contact type, and top gate top contact type.

EXAMPLES

In the following, the present invention will be explained in detail using examples. The examples below are only examples, and the present invention is not limited by these examples.

Example 1

Oxide Sintered Body

Indium oxide powder and gallium oxide powder that was adjusted so that the average particle size is 1 μm or less were prepared as raw material powders. These raw material powders were adjusted so that the ratio of the gallium oxide powder was such that the Ga/(In+Ga) atomic ratio became 0.10, and then these powders were placed together with water into a resin pot to form a slurry, and mixed using a wet ball mill. When doing this, a hard $ZrO_2$ ball was used and the mixing time was 18 hours.

After mixing, the slurry was removed from the resin pot, then filtered and dried, after which spray drying using a spray drier was performed to obtain a granulated powder. This granulated powder was filled into a rubber mold, and then pressure molded with a cold isostatic press at a pressure of 300 kgf/cm² to obtain a disk shaped molded body.

Next, the molded body was placed in a sintering furnace, and oxygen was introduced at a rate of 5 L/min per the 0.1 m³ volume of the furnace, then sintering was performed for 20 hours at a sintering temperature of 1400° C. to obtain an oxide sintered body. When doing this, the temperature was raised from room temperature to the sintering temperature at a rate of 1° C./min. Moreover, after sintering, the supply of oxygen was stopped, and the temperature was lowered from the sintering temperature to 1000° C. at a rate of 10° C./min.

The oxide sintered body that was obtained in this way was processed to a size having a 152 mm diameter and 5 mm thickness, after which the sputtering surface was polished with a cup type polisher so that the maximum height Rz was 3.0 μm or less. Next, the processed oxide sintered body was bonded to an oxygen-free backing plate using metal indium to obtain a sputtering target.

The end material that was obtained when processing the oxide sintered body was crushed, and as a result of performing composition analysis using the ICP-atomic emission spectrometry method, the oxide sintered body was confirmed to have the same gallium content as the raw material powder with the Ga/(In+Ga) atomic ratio being 0.10, and the content of unavoidable impurities being 100 ppm by mass or greater.

Moreover, as a result of measurement using an X-ray diffraction apparatus (X'Pert PRO, manufactured by Royal Philips), this oxide sintered body was confirmed to include two phases: a bixbyite-structured $In_2O_3$ phase and $\beta$-$Ga_2O_3$-structured $GaInO_3$ phase. As a result of observation using SEM-EBSD (ULTRA55, manufactured by Carl Zeiss, and HKL Channel5, manufactured by Oxford Instruments plc), the average crystal particle size of the $GaInO_3$ phase was confirmed to be 2.8 μm.

Furthermore, using the Archimedes method, the density of this oxide sintered body was confirmed to be 7.00 g/cm³.

[Amorphous Oxide Thin Film]

The obtained sputtering target was attached to the non-magnetic target cathode of a direct-current magnetron sputtering apparatus (SPK-503, manufactured by Canon Tokki Corporation) equipped with a direct-current power supply that does not have an arcing restraining function. A non-alkali glass substrate (Corning #7059) was used for the substrate, and the distance between the target and the substrate was fixed at 60 mm. After evacuating air until the pressure as $5\times10^{-5}$ Pa or less, a gas mixture of argon and oxygen where introduced until the percentage of oxygen became 1.5%, and then the gas pressure was adjusted to 0.6 Pa.

In this state, direct-current electric power of 300 W (1.64 W/cm²) was applied to generate direct-current plasma, and after performing pre-sputtering for 10 minutes, the substrate was placed in a direction above the sputtering target, or in other words in a stationary opposing position, and sputtering was performed at room temperature to form an oxide thin film. The film thickness of the obtained oxide thin film was measured using a surface shape measurement apparatus (Alpha-Step IQ, manufactured by KLA-Tencor Corporation), and as a result, the film thickness was confirmed to be 50 nm.

As a result of performing composition analysis of the oxide thin film using the ICP-atomic emission spectrometry method, it was confirmed that this oxide thin film, similar to the oxide sintered body, had a gallium content such that the Ga/(In+Ga) atomic ratio was 0.10, and also did not contain any tin.

From performing measurement using an X-ray diffraction apparatus, it was confirmed that there was no peak in the diffraction pattern for bixbyite-structured $In_2O_3$ phase, $\beta$-$Ga_2O_3$-structured $GaInO_3$ phase, and $(Ga, In)_2O_3$ phase. In other words, this oxide thin film was confirmed to be highly amorphous. On the other hand, high-temperature X-ray diffraction measurement was performed on a separately prepared sample, and as a result, it was confirmed that the crystallization temperature of this oxide thin film was 245° C.

Furthermore, a wet etching test was performed for a separately prepared sample. More specifically, the sample was immersed for one minute in an etchant (ITO-06N, manufactured by Kanto Chemical Co., Inc.) that was heated to 30° C. As a result, it was confirmed that for this oxide thin film, etching was possible with no problem, and there was no etching residue. Furthermore, by finding the difference in the film thickness before and after etching, it was confirmed that the etching rate was 32 nm/min.

In Table 2, in the evaluation of the wet etching test, samples for which etching was possible with no problems and without any etching residue are indicated as 'Excellent', samples for which etching was possible with no problems and with only a little etching residue being generated are indicated as 'Good', and samples for which etching residue was generated and problems occurred are indicated as 'Poor'.

[Crystalline Oxide Semiconductor Thin Film]

Oxide semiconductor thin film was obtained by performing an annealing process in an air atmosphere at 325° C. for 30 minutes on the amorphous oxide thin film that was obtained as described above.

As a result of measurement using an X-ray diffraction apparatus, it was confirmed that this oxide semiconductor thin film was crystallized, and was bixbyite-structured indium oxide single phase with a major peak at $In_2O_3$ (222).

Moreover, the carrier density and specific resistance of the oxide semiconductor thin film were measured using a Hall effect measurement apparatus (ResiTest8400, manufactured by Toyo Corporation), and the carrier mobility was measured from these results. As a result, it was confirmed that the carrier density of this oxide semiconductor thin film was $2.0\times10^{17}$ cm$^{-3}$, and the carrier mobility was 22.5 cm²V$^{-1}$sec$^{-1}$.

Finally, the average transmittance of this oxide semiconductor thin film was measured using a spectrophotometer (V-670, manufactured by JASCO Corporation), and was confirmed to be 80% or greater. These results are given in Table 1 and 2.

Examples 2 to 11

Except for making the manufacturing conditions for manufacturing the oxide sintered body and the oxide semiconductor thin film as illustrated in Tables 1 and 2, the oxide sintered body, amorphous oxide thin film and crystalline oxide semiconductor thin film were obtained in the same way as in Example 1. Moreover, evaluation was performed in the same way as in Example 1. The results are given in Tables 1 and 2.

Comparative Example 1

In reference to WO 2010219538 (A1), indium oxide powder having an average particle size of approximately 1.2

µm and gallium oxide powder having an average particle size of approximately 1.5 µm were used as the raw material powder; the gallium content was adjusted so that the Ga/(In+Ga) atomic ratio was 0.08; then an oxide sintered body was made at a sintering temperature of 1400° C., and that oxide sintered body was evaluated.

Moreover, an amorphous oxide thin film was formed in the same way as in Example 1 using this oxide sintered body as a target, and that amorphous oxide thin film was evaluated. As a result of measurement using an X-ray diffraction apparatus, it was confirmed that in the amorphous oxide thin film of Comparative Example 1 there was a small amount of minute crystals in the thin film that originated from bixbyite-structured $In_2O_3$ phase. Then, when observing the surface of the film after performing a wet etching test, it was confirmed that there was etching residue, and that etching was not uniform.

Furthermore, except for making the annealing temperature 300° C., the crystalline oxide semiconductor thin film was obtained in the same way as in Example 1, and that crystalline oxide semiconductor thin film was evaluated. As a result of measurement using an X-ray diffraction apparatus, it was confirmed for the crystalline oxide semiconductor thin film of Comparative Example 1 that the crystal phase was mainly bixbyite-structured $In_2O_3$ phase. The results are given in Tables 1 and 2.

Comparative Examples 2 and 3

Except for making the annealing temperature as given in Table 2, the oxide sintered body, amorphous oxide thin film, and crystalline oxide semiconductor thin film were obtained in the same way as in Comparative Example 1. Moreover, each was evaluated in the same way as in Example 1. The results are given in Tables 1 and 2.

Comparative Example 4

In reference to JP 2011146571 (A), indium oxide power having an average particle size of 1 µm and gallium oxide having an average particle size of approximately 1 µm were prepared as the raw material powder, an oxide sintered body was made at sintering temperature of 1600° C., and that oxide sintered body was evaluated.

Moreover, an amorphous oxide thin film was formed in the same way as in Example 1 using this oxide sintered body as a target, and that amorphous oxide thin film was evaluated. As a result of measurement using an X-ray diffraction apparatus, it was confirmed that in the amorphous oxide thin film of Comparative Example 4 there were minute crystals in the thin film that originated from bixbyite-structured $In_2O_3$ phase. Then, when visually observing the surface of the film after performing a wet etching test, it was confirmed that there was etching residue, and that etching was not uniform.

Furthermore, except for making the annealing temperature 300° C., the crystalline oxide semiconductor thin film was obtained in the same way as in Example 1, and that crystalline oxide semiconductor thin film was evaluated. The results are given in Tables 1 and 2.

Comparative Example 5

Except for adjusting the Ga/(In+Ga) atomic ratio of the raw material powder to 0.12 as given in Table 1, an oxide sintered body, an amorphous oxide thin film and a crystalline oxide semiconductor thin film were obtained in the same way as in Comparative Example 4 in reference to JP 2011146571 (A). Moreover, evaluation of each was performed in the same way as in Example 1. The results are given in Tables 1 and 2.

Comparative Example 6

Except for adjusting the Ga/(In+Ga) atomic ratio in the raw material powder to be 0.50, and making the substrate temperature and manufacturing conditions during film formation as given in Tables 1 and 2, an oxide sintered body, an amorphous oxide thin film and a crystalline oxide semiconductor thin film were obtained in the same way as in Example 1. Moreover, evaluation of each was performed in the same way as in Example 1. The results are given in Tables 1 and 2.

In Comparative Example 6, as a result of X-ray diffraction measurement after the annealing process, it was confirmed that besides a (222) peak for the bixbyite-structured $In_2O_3$ phase, there was also a (111) peak for the $\beta$-$Ga_2O_3$-structured $GaInO_3$ phase, however, the strength of either peak was relatively low when compared with the other Examples and Comparative Examples, which suggested that the crystallinity was low.

Moreover, in Comparative Example 6, Hall effect measurement of the obtained crystalline oxide semiconductor thin film was performed in the same way as in Example 1, however, the carrier density and carrier mobility were both the measurement limit.

TABLE 1

| | | Oxide Sintered Body | | | |
|---|---|---|---|---|---|
| | Ga/(In + Ga) Atomic Ratio | Sintering Temperature (° C.) | Sintered Body Structure* | $GaInO_3$ Phase Average Particle Size (µm) | Density (g/cm$^3$) |
| Ex. 1 | 0.10 | 1400 | A + B | 2.8 | 7.00 |
| Ex. 2 | 0.12 | 1400 | A + B | 2.6 | 7.01 |
| Ex. 3 | 0.09 | 1400 | A + B | 2.9 | 7.03 |
| Ex. 4 | 0.15 | 1400 | A + B | 2.7 | 6.91 |
| Ex. 5 | 0.20 | 1400 | A + B | 2.6 | 6.84 |
| Ex. 6 | 0.30 | 1400 | A + B | 2.8 | 6.70 |
| Ex. 7 | 0.45 | 1400 | A + B | 4.4 | 6.47 |
| Ex. 8 | 0.16 | 1400 | A + B | 2.8 | 6.88 |
| Ex. 9 | 0.19 | 1400 | A + B | 2.6 | 6.86 |
| Ex. 10 | 0.20 | 1400 | A + B | 2.6 | 6.84 |
| Ex. 11 | 0.40 | 1500 | A + B + C | 4.1 | 6.35 |

TABLE 1-continued

| | | | | | | |
|---|---|---|---|---|---|---|
| CE. 1 | 0.08 | 1400 | A | — | | 6.87 |
| CE. 2 | 0.08 | 1400 | A | — | | 6.87 |
| CE. 3 | 0.08 | 1400 | A | — | | 6.87 |
| CE. 4 | 0.10 | 1600 | A | — | | 6.98 |
| CE. 5 | 0.12 | 1600 | A | — | | 6.91 |
| CE. 6 | 0.50 | 1500 | A + B + C | 4.6 | | 6.38 |

*Sintered body structure
A: Bixbyite-structured $In_2O_3$ phase
B: β-$GaO_3$-structured $GaInO_3$ phase
C: $(Ga, In)_2O_3$ phase

| | | Oxide Thin Film (Before Annealing) | | | | |
|---|---|---|---|---|---|---|
| | Ga/(In + Ga) Atomic Ratio | Substrate Temperature (° C.) | Film Thickness (nm) | Thin Film Crystallinity | Crystallization Temperature (° C.) | Etching Evaluation | Etching Rate (nm/min) |
| Ex. 1 | 0.10 | RT | 50 | Amorphous | 245 | Excellent | 32 |
| Ex. 2 | 0.12 | RT | 50 | Amorphous | 270 | Excellent | 34 |
| Ex. 3 | 0.09 | RT | 50 | Amorphous | 225 | Excellent | 34 |
| Ex. 4 | 0.15 | RT | 50 | Amorphos | 315 | Excellent | 34 |
| Ex. 5 | 0.20 | 250 | 50 | Amorphos | 310 | Excellent | 32 |
| Ex. 6 | 0.30 | 300 | 50 | Amorphos | 465 | Excellent | 28 |
| Ex. 7 | 0.45 | 300 | 50 | Amorphos | 475 | Excellent | 16 |
| Ex. 8 | 0.16 | RT | 50 | Amorphos | 320 | Excellent | 33 |
| Ex. 9 | 0.19 | RT | 50 | Amorphos | 340 | Excellent | 29 |
| Ex. 10 | 0.20 | RT | 50 | Amorphos | 355 | Excellent | 35 |
| Ex. 11 | 0.40 | 300 | 50 | Amorphos | 470 | Excellent | 22 |
| CE. 1 | 0.08 | RT | 50 | Microcrystals | 195 | Poor | 3 |
| CE. 2 | 0.08 | RT | 50 | Microcrystals | 195 | Poor | 3 |
| CE. 3 | 0.08 | RT | 50 | Microcrystals | 195 | Poor | 3 |
| CE. 4 | 0.10 | RT | 50 | Microcrystals | 200 | Poor | 5 |
| CE. 5 | 0.12 | RT | 50 | Microcrystals | 205 | Poor | 7 |
| CE. 6 | 0.50 | 300 | 50 | Amorphos | 495 | Excellent | 15 |

* Substrate Temperature - RT: Room Temperature;

TABLE 2

| | | | | | Oxide Semiconductor Thin Film (After Annealing) | |
|---|---|---|---|---|---|---|
| | | Annealing Process | | Thin Film Structure | | |
| | Ga/(In + Ga) Atomic Ratio | Atmosphere | Temperature (° C.) | Processing Time (min) | (Diffraction pattern of other than the $In_2O_3$ phase) | Carrier Density ($\times 10^{17}$ cm$^{-3}$) | Carrier Mobility (cm$^2$V$^{-1}$s$^{-1}$) |
| Ex. 1 | 0.10 | Air | 325 | 30 | A (No) | 2.0 | 22.5 |
| Ex. 2 | 0.12 | Air | 375 | 30 | A (No) | 0.97 | 18.8 |
| Ex. 3 | 0.09 | Air | 325 | 30 | A (No) | 4.6 | 20.5 |
| Ex. 4 | 0.15 | Air | 375 | 30 | A (No) | 0.34 | 16.0 |
| Ex. 5 | 0.20 | Air | 375 | 30 | A (No) | 1.90 | 15.5 |
| Ex. 6 | 0.30 | Air | 500 | 30 | A (No) | 1.2 | 15.1 |
| Ex. 7 | 0.45 | Air | 500 | 30 | A (No) | 0.78 | 10.5 |
| Ex. 8 | 0.16 | Air | 375 | 30 | A (No) | 0.093 | 12.6 |
| Ex. 9 | 0.19 | Air | 400 | 30 | A (No) | 0.074 | 11.3 |
| Ex. 10 | 0.20 | Air | 400 | 30 | A (No) | 0.083 | 10.1 |
| Ex. 11 | 0.40 | Air | 500 | 30 | A (No) | 0.93 | 12.2 |
| CE. 1 | 0.08 | Air | 300 | 30 | A (No) | 20 | 25.9 |
| CE. 2 | 0.08 | Air | 350 | 30 | A (No) | 12 | 20.2 |
| CE. 3 | 0.08 | Air | 400 | 30 | A (No) | 6.0 | 18.3 |
| CE. 4 | 0.10 | Air | 300 | 30 | A (No) | 8.2 | 23.1 |
| CE. 5 | 0.12 | Air | 300 | 30 | A (No) | 6.8 | 20.3 |
| CE. 6 | 0.50 | Air | 600 | 30 | A + B (B) | X | X |

* Carrier Density and Carrier Mobility - X: Measurement not possible
Thin Film Structure - A: Bixbyite-structured $In_2O_3$ phase, B: β-$GaO_3$-structured $GaInO_3$ phase

[Evaluation]

According to Tables 1 and 2, the oxide semiconductor thin films of Examples 1 through 11 that are within the technical range of the present invention are formed using an oxide sintered body that includes bixbyite-structured $In_2O_3$ phase and β-$Ga_2O_3$-structured $GaInO_3$ phase, or bixbyite-structured $In_2O_3$ phase, β-$Ga_2O_3$-structured $GaInO_3$ phase and $(Ga, In)_2O_3$ phase as a target, so before the annealing process the films were confirmed to be highly amorphous and to have excellent etching characteristics. Moreover, after the annealing process, it was confirmed that the films included only bixbyite-structured $In_2O_3$ phase, and that both a carrier density of $5.0 \times 10^{17}$ cm$^{-3}$, and a carrier mobility of 10 cm$^2$V$^{-1}$sec$^{-1}$ or greater were simultaneously achieved. Particularly, in the case of Examples 1, 2 and 4 to 6 in which the Ga/(In+Ga) atomic ratio was within the range 0.10 to 0.30, it was confirmed that by making the film formation conditions and annealing conditions suitable, both a carrier density of $2.0 \times 10^{17}$ cm$^{-3}$ or less, and a carrier mobility of 15 cm$^2$V$^{-1}$sec$^{-1}$ or greater were simultaneously achieved. Moreover, in Examples 8 to 10 in which the Ga/(In+Ga) atomic ratio was within the range of greater than 0.15 but less than or equal to 0.20, it was confirmed that even though the carrier mobility was less than 15 cm$^2$V$^{-1}$sec$^{-1}$, it was possible to lower the carrier density to $2.0 \times 10^{16}$ cm$^{-3}$ or less by adopting the specified film formation condition and annealing condition.

However, in the oxide sintered bodys of Comparative Examples 1 to 3 that were made in reference to WO 2010032422 (A1), the gallium content was such that the Ga/(In+Ga) atomic ratio was 0.08, so it was confirmed that each compact included only bixbyite-structured In$_2$O$_3$ phase. Moreover, for the oxide semiconductor thin films that were obtained by film formation with these oxide sintered bodys as targets, it was confirmed that even though before annealing the films were amorphous, there were minute crystals, and the etching characteristics could not be said to be sufficient. The crystallization temperatures of these amorphous semiconductor thin films were all 225° C. or less. Furthermore, for the crystalline oxide semiconductor thin films that were obtained by performing an annealing process on these oxide semiconductor thin films, it was confirmed that even though the carrier mobility was 10 cm$^2$V$^{-1}$sec$^{-1}$ or greater, the carrier density exceeded $5.0 \times 10^{17}$ cm$^{-3}$.

On the other hand, the oxide sintered bodys of Comparative Examples 4 and 5 that were made in reference to JP 2011146571 (A), as in the case of Comparative Example 1 to 3, were confirmed to include only bixbyite-structured In$_2$O$_3$ phase. Moreover, for the oxide semiconductor thin films that were obtained by film formation with these oxide sintered bodys as targets, it was confirmed that even though before annealing, the films were amorphous, there were minute crystals, and the etching characteristics could not be said to be sufficient. The crystallization temperatures of these amorphous semiconductor thin films were all 225° C. or less. Furthermore, for the crystalline oxide semiconductor thin films that were obtained by performing an annealing process on these oxide semiconductor thin films, it was confirmed that even though the carrier mobility was 10 cm$^2$V$^{-1}$sec$^{-1}$ or greater, the carrier density exceeded $5.0 \times 10^{17}$ cm$^{-3}$.

Comparative Example 6 is an example in which the Ga/(In+Ga) atomic ratio is 0.50, however, the oxide sintered body that was obtained in this Comparative Example was confirmed to include the three phases: bixbyite-structured In$_2$O$_3$ phase, and β-Ga$_2$O$_3$-structured Ga$_2$InO$_3$ phase and (Ga, In)$_2$O$_3$ phase. Moreover, for the oxide semiconductor thin film that was obtained by film formation using this oxide sintered body as a target, it was confirmed that the film before the annealing process was highly amorphous and had excellent etching characteristics. However, the crystallization temperature of this amorphous oxide thin film was a high 600° C. Furthermore, the crystalline oxide semiconductor thin film that was obtained by performing an annealing process on this oxide semiconductor thin film was confirmed to include two phases: bixbyite-structured In$_2$O$_3$ phase, and β-Ga$_2$O$_3$-structured Ga$_2$InO$_3$ phase, and it was confirmed that the carrier density and carrier mobility were both at the measurement limit or less.

Example 12

On the surface of a 300 nm thick Si substrate on which a SiO$_2$ film was formed by thermal oxidation, a 50 nm thick oxide semiconductor thin film was formed at room temperature using a direct-current magnetron sputtering method with the oxide sintered body that was obtained in Example 1 (Ga/(In+Ga) atomic ratio=0.10) as a target. The sputtering conditions were the same as in Example 1.

Next, patterning was performed by etching the obtained oxide semiconductor thin film under the same conditions as the wet etching test in Example 1.

The oxide semiconductor thin film after etching was then crystallized by performing annealing under the same conditions as in Example 1, or in other words, for 30 minutes in an air atmosphere at 325° C. As a result, the Si substrate, SiO$_2$ film and crystalline oxide semiconductor thin film were taken to be the gate electrode, gate insulation film and channel layer.

A 5 nm thick Ti film and a 100 nm thick Au film were formed in that order on the surface of this channel layer by a direct-current magnetron sputtering method, to form a source electrode and drain electrode from the layered Au/Ti film. When doing this, patterning was performed using a metal mask, and by forming the source electrode and drain electrode films so that the channel length was 100 μm and the channel width was 450 μm, a thin-film transistor having the construction illustrated in FIG. 1 was obtained. The film formation conditions for forming the source electrode and the drain electrode were the same as the film formation conditions for forming the oxide semiconductor thin film except that the sputtering gas was just argon, and the direct-current power was changed to 50 W.

The operating characteristics of the obtained thin-film transistor were analyzed using a semiconductor parameter analyzer (420CS, manufactured by Keithley Instruments). As a result, the operating characteristics of the thin-film transistor could be confirmed. It was confirmed that for this thin-film transistor, the field-effect mobility was 27.9 cm$^2$V$^{-1}$sec$^{-1}$, the on/off ratio was $2 \times 10^8$, and the S value was 1.0, which were all good values.

Example 13

Except for using the oxide sintered body that was obtained in Example 2 (Ga/(In+Ga) atomic ratio=0.12) as the target, and crystallizing the oxide semiconductor thin film after etching by performing annealing for 30 minutes in an air atmosphere at 375° C., the thin-film transistor was made in the same way as in Example 12.

The operating characteristics of the obtained thin-film transistor were analyzed using a semiconductor parameter analyzer as in Example 12. As a result, the operating characteristics of the thin-film transistor could be confirmed. It was confirmed that for this thin-film transistor, the field-effect mobility was 20.2 cm$^2$V$^{-1}$sec$^{-1}$, the on/off ratio was $7 \times 10^8$, and the S value was 0.9, which were all good values.

TABLE 3

| | Ga/(In + Ga) Atomic Ratio | Annealing Process | | | Thin Film Transistor | | |
| | | Atmosphere | Temperature (° C.) | Processing Time (min) | Field-effect Mobility ($cm^2V^{-1}sec^{-1}$) | On/Off Ratio | S Value |
|---|---|---|---|---|---|---|---|
| EX. 12 | 0.10 | Air | 325 | 30 | 27.9 | $2 \times 10^8$ | 1.0 |
| EX. 13 | 0.12 | Air | 375 | 30 | 20.2 | $7 \times 10^8$ | 0.9 |

[Evaluation]

For Examples 12 and 13, it was possible to confirm the operating characteristics as a thin-film transistor, and it was confirmed that the on/off ratio, the field-effect mobility and the S value all had good values.

EXPLANATION OF REFERENCE NUMBERS

1 Gate electrode
2 Gate insulation film
3 Channel layer
4 Source electrode
5 Drain electrode

What is claimed is:

1. An oxide semiconductor thin film obtained from an oxide sintered body that comprises indium, gallium and unavoidable impurities and being crystalline; wherein
   the oxide sintered body comprises a bixbyite-structured $In_2O_3$ phase and a $\beta$-$Ga_2O_3$-structured $GaInO_3$ phase, or a bixbyite-structured $In_2O_3$ phase, a $\beta$-$Ga_2O_3$-structured $GaInO_3$ phase and a $(Ga, In)_2O_3$ phase; and
   the gallium content expressed by the Ga/(In+Ga) atomic ratio is greater than 0.15 and less than or equal to 0.45, and the crystal phase is constructed only by bixbyite-structured $In_2O_3$ phase.

2. The oxide semiconductor thin film according to claim 1, wherein the gallium content expressed by the Ga/(In+Ga) atomic ratio is greater than 0.15 and less than or equal to 0.30.

3. The oxide semiconductor thin film according to claim 1, wherein a carrier density is less than or equal to $5.0 \times 10^{17}$ $cm^{-3}$.

4. The oxide semiconductor thin film according to claim 1, wherein a carrier mobility is greater than or equal to 10 $cm^2V^{-1}sec^{-1}$.

5. The oxide semiconductor thin film according to claim 1, wherein the crystallization temperature of amorphous film before crystallizing by an annealing process is greater than or equal to 225° C.

6. A thin-film transistor comprising a source electrode, a drain electrode, a gate electrode, a channel layer, and a gate insulation film, wherein the channel layer comprises the oxide semiconductor thin film according to claim 1.

7. A display comprising the thin-film transistor according to claim 6.

* * * * *